United States Patent [19]
Popovic

[11] Patent Number: 5,194,750
[45] Date of Patent: Mar. 16, 1993

[54] HIGH PRECISION CCD MAGNETIC FIELD SENSOR

[75] Inventor: Radivoje Popovic, Zug, Switzerland

[73] Assignee: Landis & Gyr Betriebs AG, Zug, Switzerland

[21] Appl. No.: 851,633

[22] Filed: Mar. 16, 1992

[30] Foreign Application Priority Data

Apr. 11, 1991 [CH] Switzerland .................. 01086/91

[51] Int. Cl.[5] .................. H01L 29/78; G11C 19/28
[52] U.S. Cl. .................. 257/225; 257/235; 257/239; 257/240; 257/421; 257/623; 377/60; 377/61
[58] Field of Search ............. 357/24, 27; 377/57-63

[56] References Cited

U.S. PATENT DOCUMENTS

| 3,906,359 | 4/1975 | Blaha et al. | 357/24 |
| 4,801,991 | 1/1989 | Hisa | 357/27 |
| 5,083,174 | 1/1992 | Kub | 357/27 |

FOREIGN PATENT DOCUMENTS 3325148  3/1984  Fed. Rep. of Germany .

OTHER PUBLICATIONS

Chang et al "Charge-Coupled Device Magnetic Field Sensor" IBM Technical Disclosure Bulletin vol. 14 (Apr. 1972) p. 3420.

Primary Examiner—Gene M. Munson
Attorney, Agent, or Firm—Marmorek, Guttman & Rubenstein

[57] ABSTRACT

A magnetic field sensor, having a charge-coupled device formed in a semiconductor region is disclosed. The magnetic field sensor has first and second contact zones, made of a heavily doped semiconductor material of a first conductivity type, located on an outer surface of the semiconductor region which is made of a semiconductor material of a second conductivity type. The magnetic field sensor also has an insulating layer, located on the outer surface of the semiconductor region, which has passages for sensor connections associated with each contact zone. The charge-coupled device has a plurality of gate electrodes located on the insulating layer which are arranged perpendicularly to the desired direction of charge propagation through the charge-coupled device. One end of at least one centrally located electrode at least partially overlaps the first contact zone while another end at least partially overlaps the second contact zone.

14 Claims, 7 Drawing Sheets

HIGH PRECISION CCD MAGNETIC FIELD SENSOR

FIELD OF THE INVENTION

The present invention relates to charge-coupled devices which may illustratively be used as high-precision, high-quality magnetic field sensors in various instruments such as electricity counters, compasses or motion sensors.

BACKGROUND OF THE INVENTION

Semiconductor magnetic field sensors have been disclosed in the prior art. See. e.g., European Patent No. 0148 330 A2. In this particular reference, a Hall element is disclosed having first and second contact zones which are both made of a semiconductor material of conductivity type P. These zones are located on an outer surface of a semiconductor material of another conductivity type N and are provided with a sensor connection S1 or S2. An insulating layer is provided on the outer surface of the semiconductor material of conductivity type N with passages for the sensor connections S1 and S2.

In the operation of Hall-effect components, the electrical current flow is known to result from charged-carrier drift or of charged-carrier diffusion. This form of charge transport depends on the properties of the semiconductor used and on the environmental conditions. Any change in the semiconductor properties or the environment causes a change in the output signal of the Hall-effect component. Hall-effect components are particularly sensitive to surface effects, encapsulation stress, light, temperature, changes in the material doping density, etc. Therefore, to obtain high-precision magnetic field sensors, the Hall effect component must be made of a special semiconductor material, including a special encapsulation, and by means of non-standard process steps. Furthermore, external temperature variations must be compensated for. For this reason, it is difficult to integrate a good Hall-effect component into a signal processing circuit.

An object of the present invention is to provide a magnetic field sensor which is capable of measuring magnetic fields with high precision. An additional object of the present invention is to provide a high precision magnetic field sensor which can be manufactured using conventional standard integrated circuit MOS technology and which can be integrated without additional process steps into a complex conventional MOS circuit. It is a further object of the present invention to provide a magnetic sensor capable of producing an output signal which is relatively independent of the properties of the semiconductor material and of environmental conditions.

SUMMARY OF THE INVENTION

These and other objects are achieved by the present invention which provides a magnetic field sensor having a charge-coupled device formed in a semiconductor region. The magnetic field sensor includes first and second contact zones made of a semiconductor material of a first conductivity type which is heavily doped with impurity atoms. Each contact zone has a respective sensor. These sensors are located on an outer surface of the semiconductor region which is made of a semiconductor material of a second conductivity type.

The invention also includes an insulating layer located on an outer surface of the semiconductor region. This insulating layer has passages for the sensors which are connected to the contact zones. Additionally, a plurality of oblong gate electrodes of the charge-coupled device are located on the insulating layer. These electrodes are arranged so as to be perpendicular to the desired direction of charge transport through the charge-coupled device. Further, one end of at least one centrally located electrode at least partially overlaps the first contact zone while the other end of this gate electrode at least partially overlaps the second contact zone.

Advantageous embodiments of the invention are shown in the drawings and are described in greater detail below.

BRIEF DESCRIPTION OF THE DRAWINGS

Identical reference number designate the same parts in all figures.

DESCRIPTION OF THE INVENTION

Figure 1:
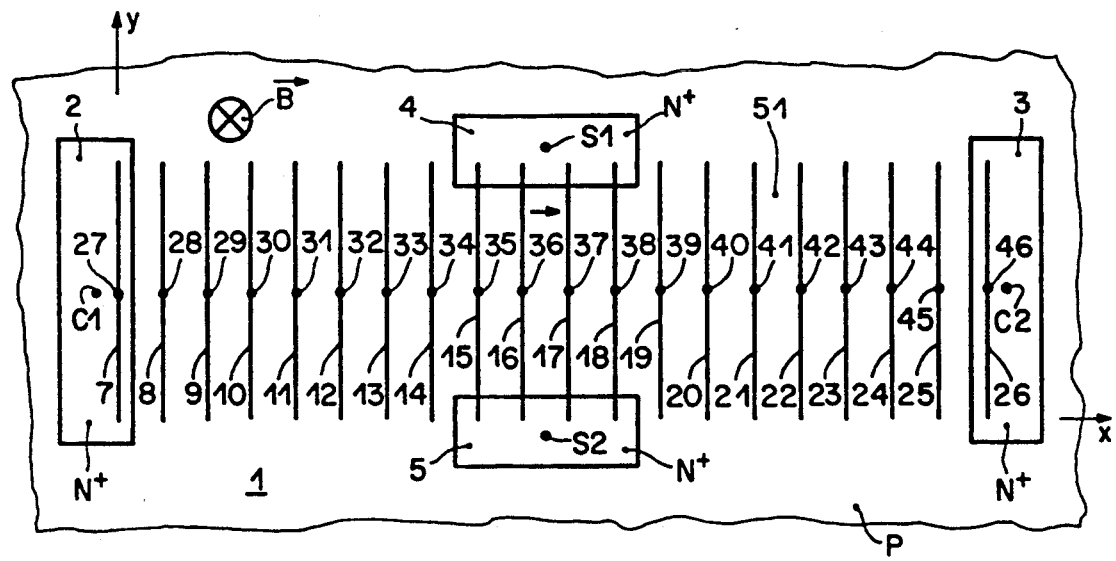
FIG. 1 is a schematic representation of the top view of a first embodiment of a magnetic field sensor according to the invention.

Referring now to FIG. 1, a first embodiment of the magnetic field sensor according to the invention is shown having a semiconductor region 1, an input zone 2, an output zone 3, a first contact zone 4, a second contact zone 5, an insulating layer 6 (FIGS. 3 and 8) and a plurality of gate electrodes 7 to 26. Each gate electrode 7-26 is provided with a respective gate connection 27-46. The input zone 2, the output zone 3 and the gate electrodes 7 to 26 form a charge-coupled device or CCD. The composition of charge-coupled devices is known and described in A. G. Milnes, Semiconductor Devices and Semiconductor Electronics, ch. 10, Van Nostrand Reinold Co., 1980.

Each of the two contact zones 4 and 5 is provided with a sensor connection S1 or S2 which is preferably directly connected to its respective contact zone 4 or 5. During the operation of the magnetic field sensor, the electrical voltage appearing between the sensor connections S1 and S2 is an output voltage $V_{s1,s2}$ of the magnetic field sensor. The input zone 2 and the output zone 3 are also each provided with an electrical connection C1 or C2.

Figure 5:
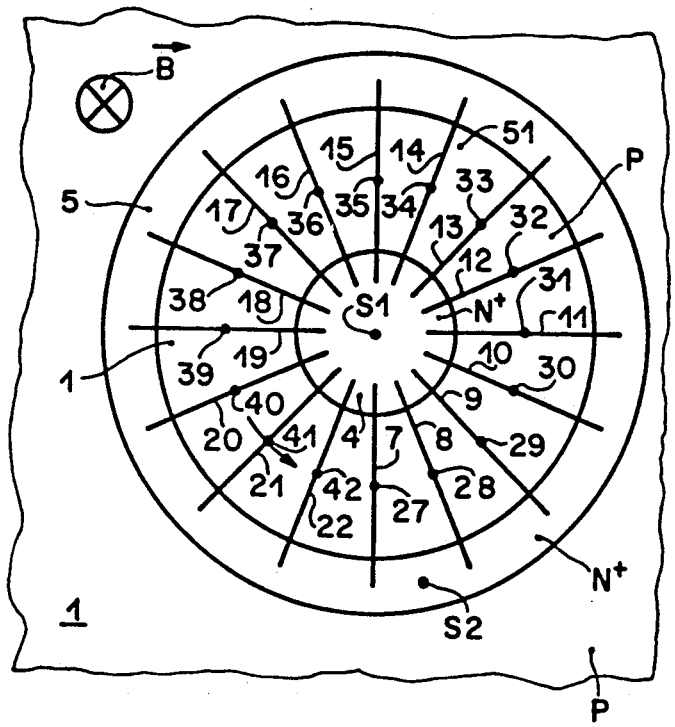
FIG. 5 is a schematic representation of the top view of a fourth embodiment of the magnetic field sensor according to the invention.

The invention depicted in the drawings is provided with twenty gate electrodes 7 to 26 per charge-coupled device, except in FIG. 5 where only sixteen gate electrodes 7 to 22 per charge-coupled device are shown. The gate electrodes are preferably made of thin, highly doped polycrystalline silicon (poly-si) layers and are preferably arranged in parallel to each other at maximum intervals of approximately 1 μm. Each is approximately 5 μm wide.

Figure 2:
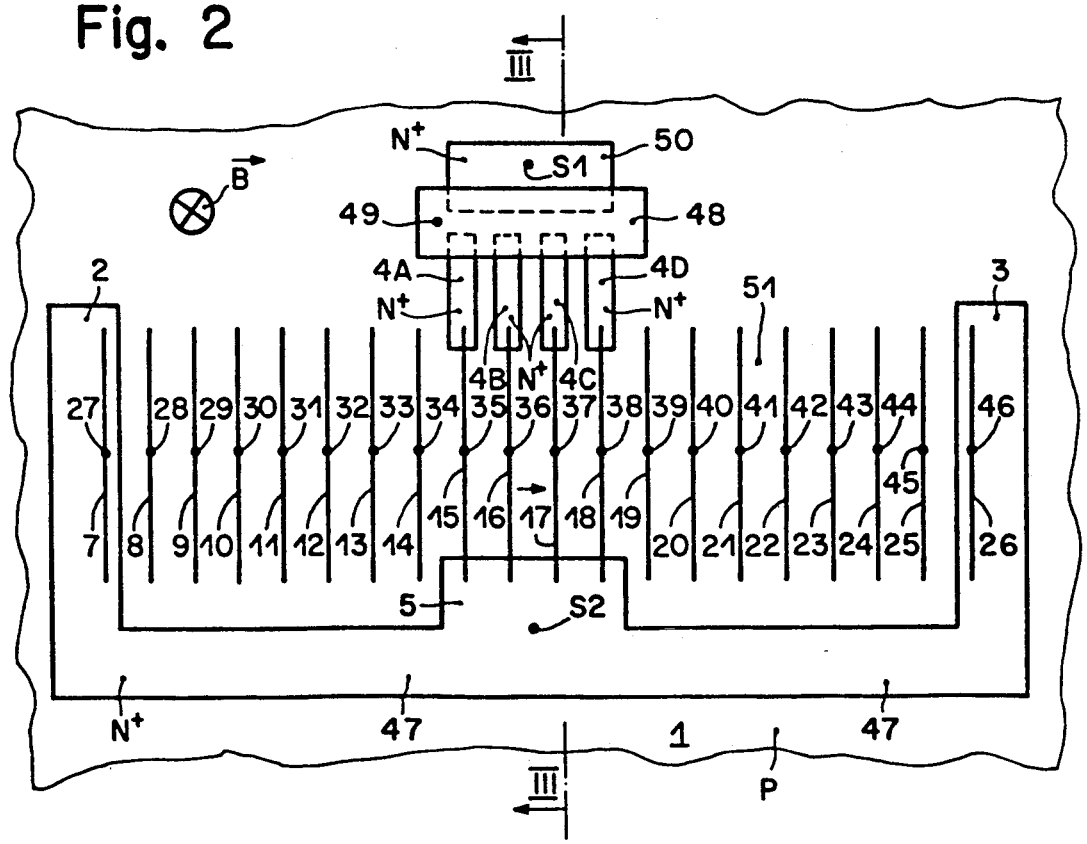
FIG. 2 is a schematic representation of the top view of a second embodiment of the magnetic field sensor according to the invention.

The insulating layer 6 (FIG. 3) is not shown in FIGS. 1 and 2 or in FIGS. 4 to 7 for reasons of clarity, although it is present in these embodiments. It is preferably made of $SiO_2$. As depicted in the drawings, the insulating layer 6 is preferably provided with passages for the sensor connections S1 and S2 as well as for the electrical connections C1 and C2.

The input zone 2, the output zone 3 and the two contact zones 4 and 5 are each made of a semiconductor material of a first conductivity type which is heavily doped with impurity atoms. Each is located in, and at the outer surface of, the semiconductor region 1 which is made of a second conductivity type. In the drawings, it is assumed that N is the first conductivity type, and P is the second. In FIG. 1, the input zone 2 and the output zone 3 are placed in parallel to the gate electrodes 7 to 26, at the ends of the row of electrodes and in the proximity of the two outer gate electrodes. As shown, the two outer gate electrodes 7, 26 at least partially overlap the adjoining input zone 2 or the adjoining output zone 3. Preferably, they are placed no farther than one micrometer from the input zone 2 or output zone 3 (without taking the insulating layer 6 into account). The insulating layer 6 is installed on the outer surface of the semiconductor material 1 of the second conductivity type P (see FIGS. 3, 8 and 12). The outer surface of the semiconductor material is preferably the surface of an integrated circuit. A magnetic field to be measured, having a magnetic induction B, is oriented at a right angle to this outer surface.

The gate electrodes 7 to 22 or 7 to 26 of at least one charge-coupled device are placed on the insulating layer 6 of all magnetic field sensors according to the present invention. These gate electrodes form a line of oblong bands extending in the direction x (see FIG. 1). The two ends of at least one of the center electrodes 15-18 overlap at least a portion of one of the two contact zones 4 and 5. Preferably, as depicted in the drawings, the two ends of four central gate electrodes, i.e., the four gate electrodes 15 to 18 in FIG. 1, overlap the two contact zones 4 and 5. In FIGS. 1-2, the oblong gate electrodes 7 to 26 are arranged in parallel to the ordinate y and constitute a straight row of electrodes, which row extends at a right angle to their longitudinal axes in the direction of the abscissa x. The dimensions of the input zone 2, the output zone 3 and the gate electrodes 7 to 26, which are oriented perpendicularly to the direction of the row of electrodes, are nearly identical.

Figure 3:
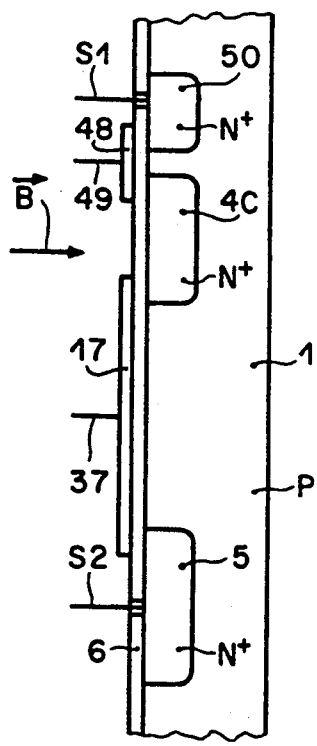
FIG. 3 shows a cross-section of the second embodiment of the magnetic field sensor shown in FIG. 2.

The second embodiment of the magnetic field sensor according to the present invention, shown in FIGS. 2 and 3, is similar to the first embodiment with some differences, one of which is only optional in the second embodiment. Firstly, one of the two contact zones 4 or 5 (e.g., the second contact zone 5), and the input zone 2 and the output zone 3, are connected to one another by means of at least one electrical connection 47. The electrical connection 47 is preferably made of a semiconductor material of the first conductivity type N+ which is heavily doped with impurity atoms. Secondly, at least one of the two contact zones 4 or 5 comprises several contact zone sub-elements 4A, 4B, 4C and 4D. Each contact zone sub-element 4A, 4B, 4C and 4D is sequentially assigned one of several different central gate electrodes 15, 16, 17 or 18. Preferably, each central gate electrode 15-18 has one end which at least partially overlaps the respective contact zone sub-element 4A, 4B, 4C or 4D or is no more than a few micrometers from the edge of their individual, respective contact zone sub-element. Furthermore, at least one read-out gate electrode 48 is installed on the insulating layer 6 (see FIG. 3) and at least partially overlaps both the contact zone sub-elements 4A, 4B, 4C and 4D and an additional contact zone element 50. The contact zone element 50 is connected to the sensor connection S1 assigned to the contact zone 4. It is made of a semiconductor material of the first conductivity type N+ which is heavily doped with impurity atoms, and is located at the outer surface of the semiconductor material 1 of the second conductivity type P. The contact zone sub-elements 4A to 4D have nearly the same width as the gate electrodes 7 to 26. The read-out gate electrode 48 is provided with an electrical connection 49.

Figure 4:
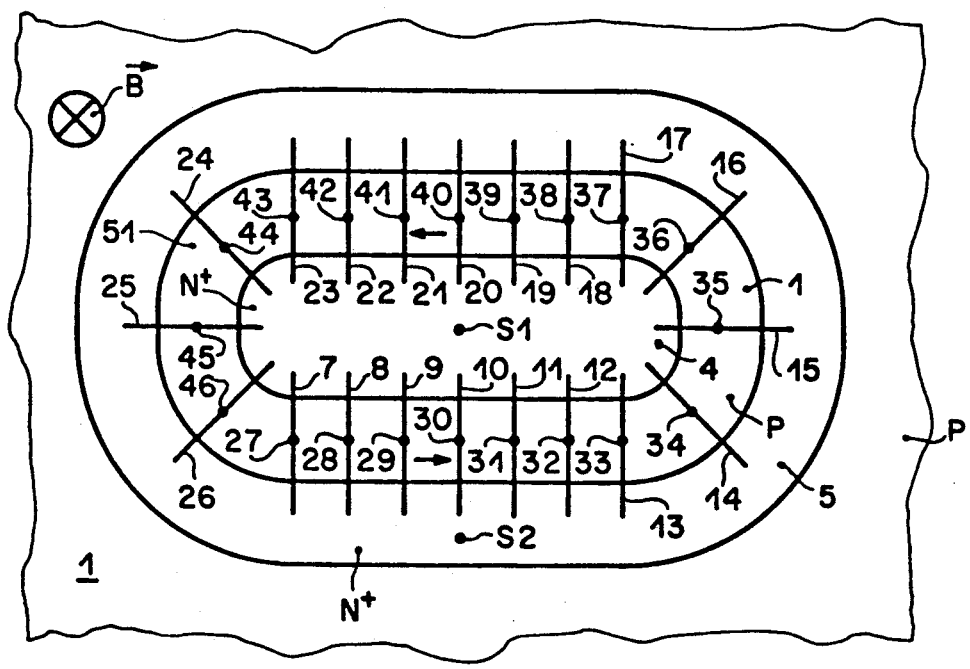
FIG. 4 is a schematic representation of the top view of a third embodiment of the magnetic field sensor according to the invention.

The third embodiment of the magnetic field sensor according to the invention is shown in FIG. 4 and is very similar to the second embodiment with the difference that the first contact zone 4 does not consist of contact zone sub-elements 4A to 4B. Further, the input zone 2 and the output zone 3 are omitted and one of the two contact zones 4 or 5 (e.g., the first contact zone 4) is placed in the center. Finally, the other contact zone (e.g., the second contact zone 5) forms an enclosed boundary which surrounds the central contact zone 4. The oblong gate electrodes 7 to 26 are placed at a right angle to the second contact zone 5 on the insulating layer 6 between the two contact zones 4 and 5 and each of their two ends overlaps one of the two contact zones 4 and 5. As depicted in FIG. 4, one end overlaps the first contact zone 4 and one end overlaps the second contact zone 5.

The fourth embodiment of the magnetic field sensor according to the invention, shown in FIG. 5, is very similar to the third embodiment of FIG. 4. The fourth embodiment is different in that the first central contact zone 4 is in the form of a circle. In FIG. 5, the second contact zone 5 is in the form of an annulus and the two contact zones 4 and 5 are concentric.

In the third and fourth embodiments, the input zone 2 (not shown) and the output zone 3 (not shown) of the charge-coupled device 51 are practically connected to each other so that charge carriers are transported in a circle.

Figure 6:
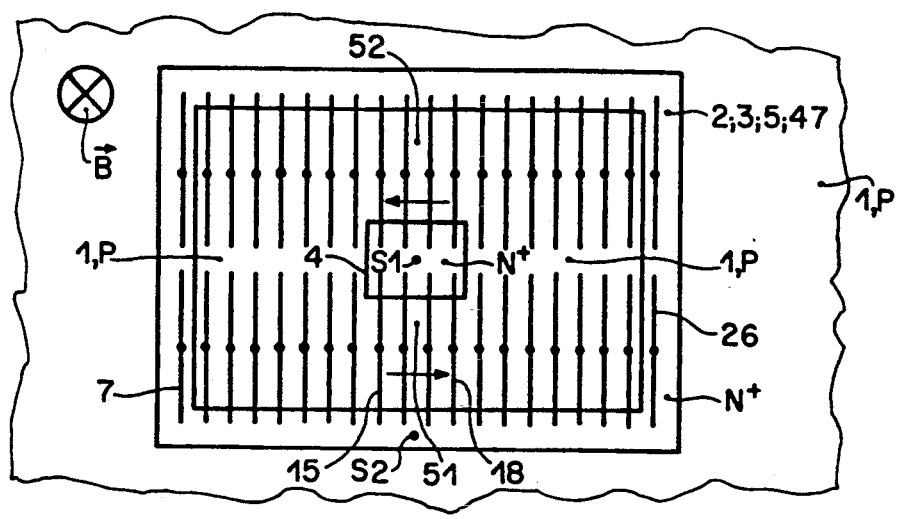
FIG. 6 is a schematic representation of the top view of a fifth embodiment of the magnetic field sensor according to the invention.
Figure 7:
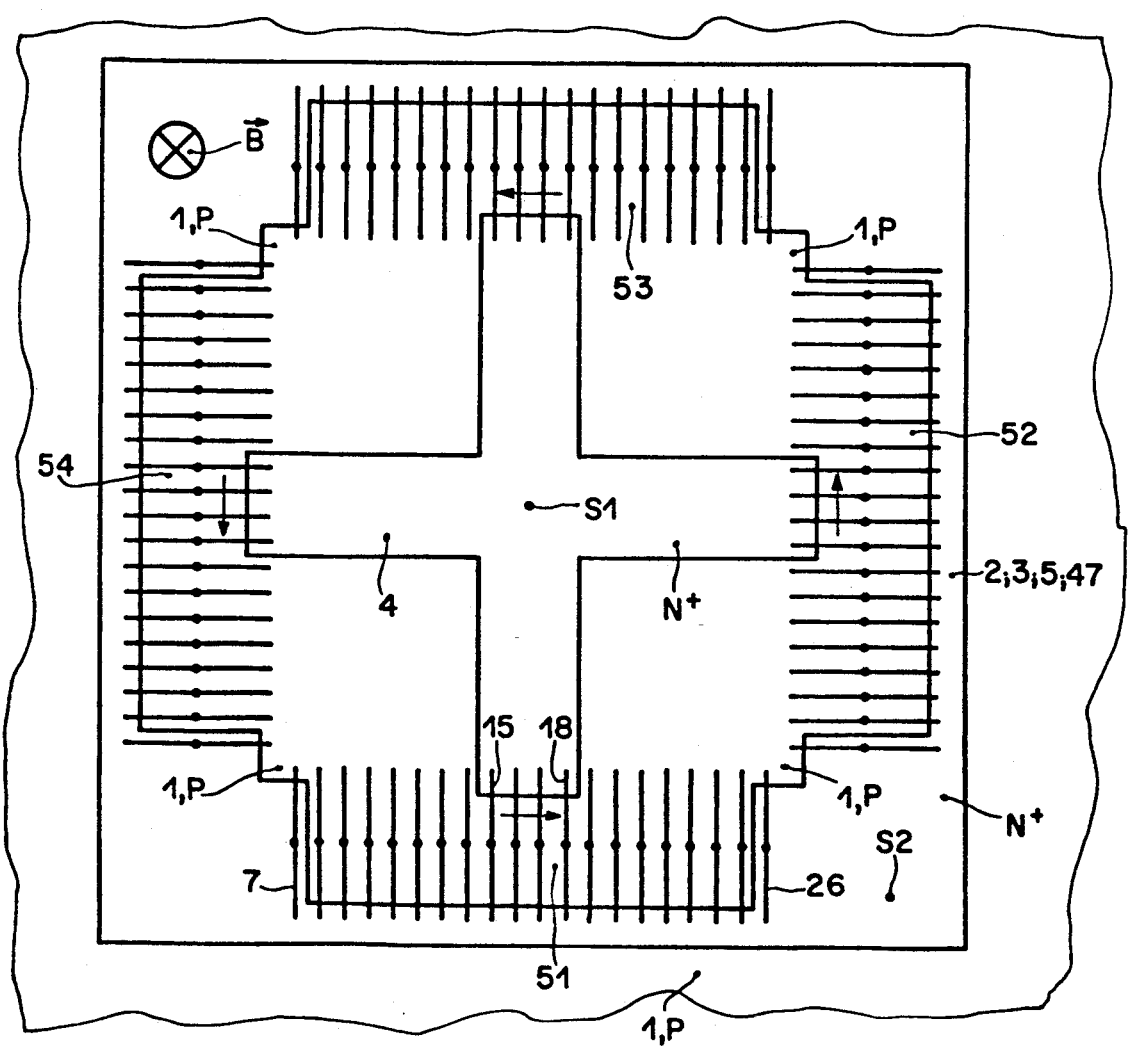
FIG. 7 is a schematic representation of the top view of a sixth embodiment of the magnetic field sensor according to the invention.

In each of the first four embodiments as well as in the seventh embodiment, which is described below, only one charge-coupled device 51 is present. In contrast, the fifth and sixth embodiments of the magnetic field sensor according to the invention (depicted in FIGS. 6 and 7)

have several, nearly identical charge-coupled devices which are all electrically connected in series. The charge-coupled devices are provided in the semiconductor region 1 of the second conductivity type P. The input zone 2, the output zone 3 and one of the two contact zones 4 or 5 (e.g., the second contact zone 5) of all of the charge-coupled devices are connected to each other by means of at least one electrical connection 47. The other zone (e.g. the first contact zone 4) is centered with respect to all of the charge-coupled devices. Each of the two ends of at least one of the central gate electrodes of each charge-coupled device overlaps one of the two contact zones 4 or 5. In FIGS. 6 and 7, the four central gate electrodes 15 to 18 of each charge-coupled device partially overlap the contact zones 4 and 5.

The fifth embodiment of the magnetic field sensor according to the invention is shown in FIG. 6. As depicted in FIG. 6, two charge-coupled devices 51 and 52 are provided in the semiconductor material 1 of the second conductivity type P and are spatially arranged in parallel. In this fifth embodiment, charge carriers are transported in two parallel but opposite directions through the two charge-coupled devices.

The sixth embodiment of the magnetic field sensor according to the invention is shown in FIG. 7. In the sixth embodiment, four charge-coupled devices 51 to 54 are provided in the semiconductor material 1 of the second conductivity type P. As depicted in FIG. 6, the central contact zone 4 is in the form of a cross as seen from above. Each of the four charge-coupled devices 51 to 54 is placed around the central first contact zone 4 along one side of a square (wherein each side of the square is parallel to a beam axis of the cross). One half of each cross beam of the first contact zone 4 is assigned to one of the charge-coupled devices 51, 52, 53 or 54. The four central gate electrodes 15 to 18 of each charge-coupled device 51, 52, 53 and 54 overlap the end of the respective cross beam half assigned to the associated charge-coupled device. In this sixth embodiment, charge carriers are transported in four different directions.

Figure 8:
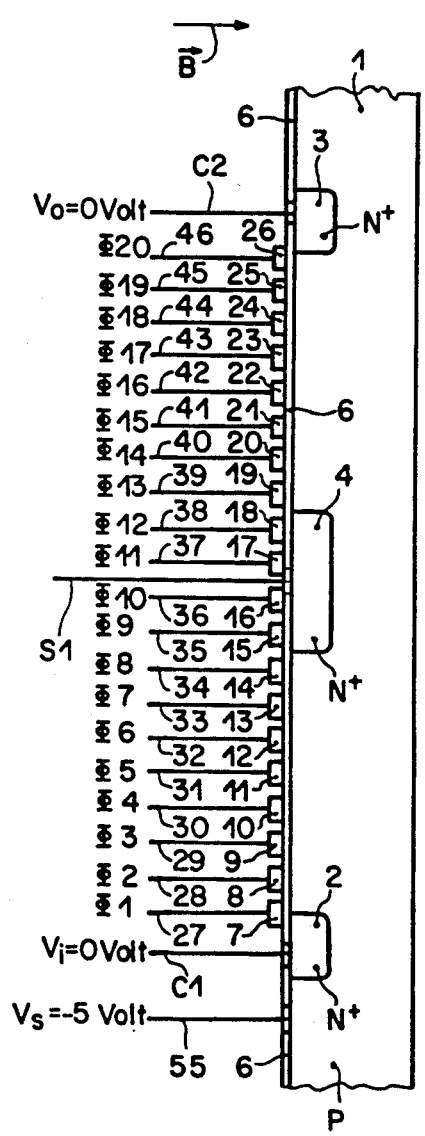
FIG. 8 shows a cross-section of the first embodiment of the magnetic field sensor depicted in FIG. 1.
Figure 9:
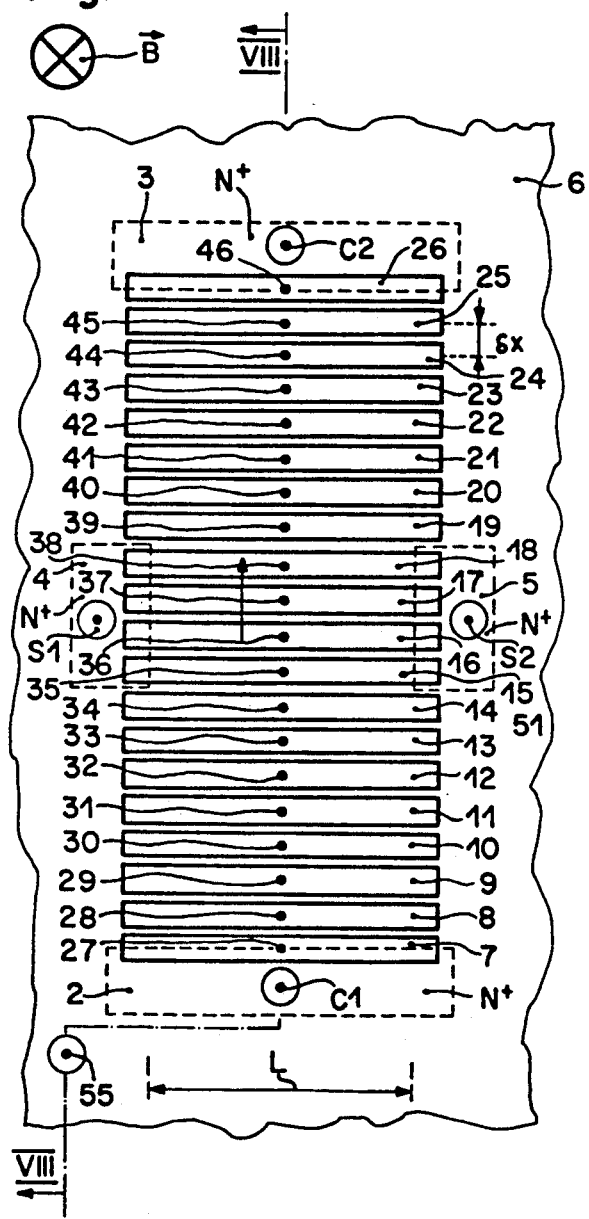
FIG. 9 shown a top view of the first embodiment of the magnetic field sensor according to the invention.
Figure 10:
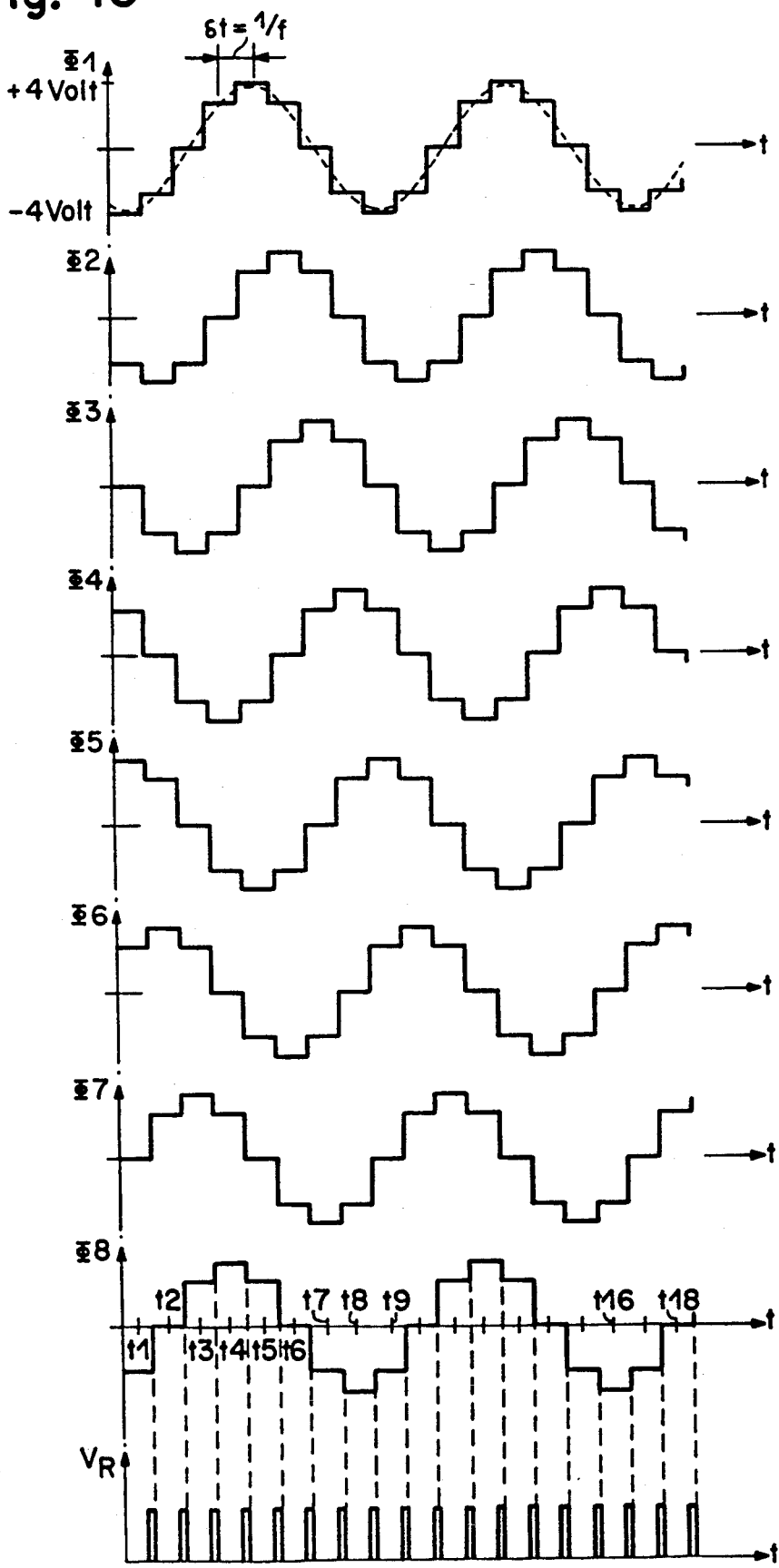
FIG. 10 is a timing diagram of voltages appearing at the gate electrodes.

The first embodiment is shown once more in FIGS. 8 and 9 in greater detail. In FIGS. 8–9, a gate voltage $\Phi_1$, $\Phi_2, \ldots, \Phi_{19}$ or $\Phi_{20}$ appears at each of the twenty gate connections 27 to 46 of the gate electrodes 7 to 26. The timing of these voltages $\Phi_1$–$\Phi_{20}$ is shown in FIG. 10 and will be discussed in greater detail below. The insulating layer 6 is provided with a passage for an electrical connection 55 to the semiconductor material 1 on which the lowest voltage $V_s$ in the magnetic field sensor appears. $V_s$ can be $-5$ V for instance. The electrical connections C1 and C2 of the input zone 2 and the output zone 3 can be 0 Volt for example. In that case, the output voltages $V_{s1,s2}$ of the second to sixth embodiments of the magnetic field sensor refer to ground, as the voltage at the sensor connection S2 is then also 0 Volts by virtue of the electrical connection 47. Alternatively, the output voltage $V_{s1,s2}$ of the first embodiment of the magnetic field sensor (see FIGS. 1 and 3) can be "floating". The distance between the center lines of two adjacent parallel gate electrodes is designated $\delta x$. The distance between the two contact zones 4 and 5 measured in the longitudinal direction of the gate electrodes 7 to 26 is designated L. In FIGS. 8–9, L is equal to the effective length of the central gate electrodes 15 to 18 which overlap the two contact zones 4 and 5.

Charge-coupled devices normally have only three phases, i.e., only three different phase shifted gate voltages $\Phi_1$, $\Phi_2$ and $\Phi_3$ are utilized. The charge-coupled devices used for a magnetic field sensor, however, preferably have at least four phases. It is assumed below that eight phases are utilized, i.e., that eight different gate voltages $\Phi_1$–$\Phi_8$, each having a different phase shift, are used as control signals for charge-coupled devices. In that case $\Phi_1 = \Phi_9 = \Phi_{17}$, $\Phi_2 = \Phi_{10} = \Phi_{18}$, $\Phi_3 = \Phi_{11} = \Phi_{19}$, $\Phi_4 = \Phi_{12} = \Phi_{20}$, $\Phi_5 = \Phi_{13}$, $\Phi_6 = \Phi_{14}$, $\Phi_7 = \Phi_{15}$ and $\Phi_8 = \Phi_{16}$.

The gate voltages $\Phi_1$ to $\Phi_8$ are depicted in the upper eight graphs of FIG. 10 as a function of time t. Each has a stair-shaped form and is shifted in time with respect to an adjacent preceding gate voltage by an interval $\delta t = 1/f$ of one stair step, where f is the pulse frequency of the gate voltage (i.e., the frequency of each voltage step). In other words $\Phi_2$ lags $\Phi_1$, $\Phi_3$ lags $\Phi_2$, $\Phi_4$ lags $\Phi_3$, $\Phi_5$ lags $\Phi_4$, $\Phi_6$ lags $\Phi_5$, $\Phi_7$ lags $\Phi_6$ and $\Phi_8$ lags $\Phi_7$ by the time $\delta t$. The amplitude of the signals are illustratively in the range $-4V$ to $+4V$. The signals are discrete sampled values of, for example, a sinusoid voltage. Such a sinusoid voltage is shown by a broken line in the first graph of FIG. 10. To obtain the discrete values of the stair step signals of the gate voltages $\Phi_1$ to $\Phi_8$, the period of the sinusoid voltage is subdivided into an integral number of time intervals $\delta t$ of equal time length, where the integral number of intervals is equal to the total number of phases (which illustratively is equal to eight). In FIG. 10, eighteen stair steps are shown per gate voltage. The mean values of each step correspond to the points in time $t_1, t_2, \ldots, t_{17}$ and $t_{18}$. The discrete values of the gate voltages, i.e., the values of the stair steps, are thus the values of the sinusoid voltage at the middle of the period $\delta t$ of each of the intervals $t_1$–$t_{18}$. Instead of the sinusoid voltage, it is also possible to use a sawtooth-shaped voltage which is periodic in time (not shown).

If a read-out gate electrode 48 is present in the second embodiment (see FIG. 2), an electrical voltage $V_R$, which is depicted as a function of time in the ninth graph of FIG. 10, must be applied to its electrical connection 49. The voltage $V_R$ consists of a series of very brief rectangular impulses which correspond in time with the end of the stair steps of the gate voltages $\Phi 1$ to $\Phi 8$. As depicted in FIG. 10, the falling edge of each impulse of the voltage $V_R$ coincides with the edges of the stair steps of the gate voltages $\Phi 1$ to $\Phi 8$. The voltage $V_R$ allows for scanned reading of the voltages appearing at the contact zone elements 4A to 4D. Such an arrangement eliminates a short-circuit effect which can arise. Generally, the electrically, very highly conductive contact zones 4 and 5 would otherwise short out several charge packets present in the charge-coupled devices, the packets being shorted out at their two ends. By using a read-out gate electrode 48, only a single charge-coupled device packet below one of the gate electrodes in contact with the contact zone elements 4A, 4B, 4C or 4D is briefly switched, for the duration of a rectangular impulse of voltage $V_R$, to the additional contact zone 50. A charge-coupled device packet conveyed in this manner appears at the sensor connection S1 of the magnetic field sensor output at the end of a transfer period, i.e., at the timely end of a stair step.

Figure 11:
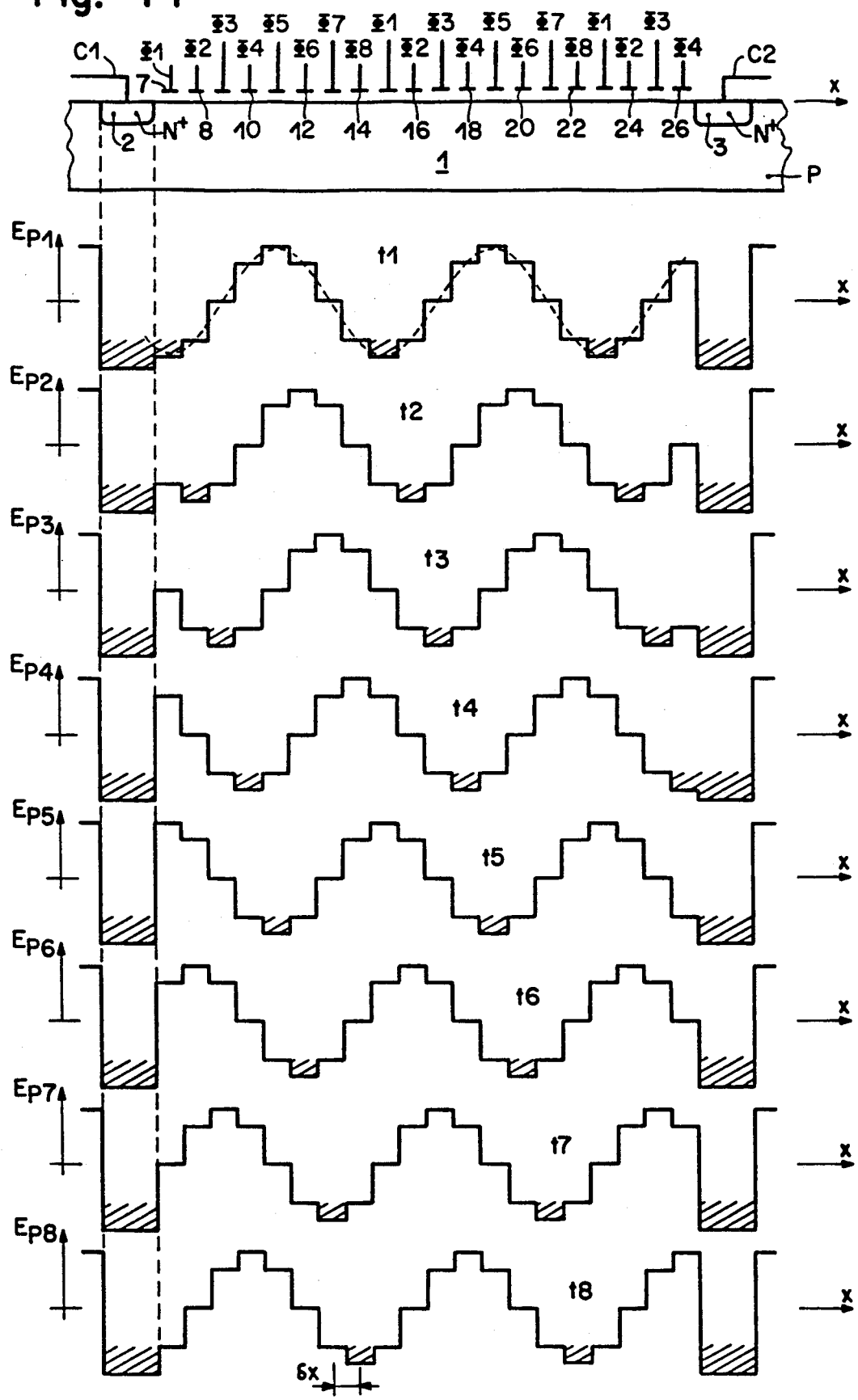
FIG. 11 shows diagrams of electric potential energies appearing at different points in time under the gate electrodes.

Referring now to FIG. 11, the operation of the magnetic field sensor is now briefly explained. A schematic cross-section of the first embodiment of the magnetic field sensor, according to the invention, is shown at the top of FIG. 11. At each point in time t1, t2, . . . , t7 or t8, a stair-shaped voltage appears at the gate electrodes 7 to 26. The respective potential energy, associated with the voltage which appears at each point on the outer surface of the semiconductor material 1, is plotted against the direction x in the eight graphs of FIG. 11. Each graph depicts the potential energy distribution $E_{p1}, E_{p2}, \ldots, E_{p8}$ along the direction x for a corresponding time period $t_1, t_2, \ldots, t_8$. In these graphs, $\delta x$ is equal to the distance, in the direction x, between the centers of two consecutive stair steps. There must be at least as many potential energy steps between both the input and output zones 2,3 and their respective, nearest central gate electrode 15 or 18 which partially overlaps the contact zones 4,5, as there are phases. FIG. 11, thus depicts eight different steps respectively between the input zone 2 and between gate electrode 15 and the output zone 3 and gate electrode 18. The intervals $\delta x$ with the lowest electrical potential energy are potential wells. They are filled with electrons and are shown with hatch marks in FIG. 11. In addition, the regions below the input zone 2 and the output zone 3 have a very low electrical potential energy. Thus, these areas are also indicated with hatch marks in FIG. 11.

The input zone 2 is heavily doped with impurity atoms. It serves as a source of charge carriers for the production of new charge packets. During the time interval $t_1$, a charge packet is injected under the first gate electrode 7 by the impulse of the gate voltage $\Phi_1$. In each potential well, a charge carrier inversion layer, comprising a charge packet with a width $\delta x$, appears. As can be seen in FIG. 11, the potential well (and its respective packet) which appears under the first gate electrode 7 at the moment $t_1$, moves step by step, from left to right along the outer surface of the semiconductor material 1. At the interval $t_2$, the charge packet is under gate electrode 8; at the interval $t_3$, under gate electrode 9; at the interval $t_7$, under gate electrode 10; at the interval $t_5$, under gate electrode 11; at the interval $t_6$, under gate electrode 12; at the interval $t_7$, under gate electrode 13; at the interval $t_8$, under gate electrode 14, etc. At the interval $t_{21}$ (not shown) the charge packet finally reaches the output zone 3. The gate voltages $\Phi_1$ to $\Phi_8$ thus produce forms of electrical voltage waves which move along the outer surface of the semiconductor material 1. The output zone 3 collects the charge packets which are delivered by the last gate electrode 26. The functions of the input zone 2 and of the output zone 3 are here interchangeable even in full operation, and determine the direction in which the charge packets are conveyed.

In both the third and fourth embodiments, the input zone 2 and the output zone 3 are omitted. In these embodiments, the charge packets are produced by internal charge generation in the semiconductor region 1. In such a case, the charge packets are generated slowly, after a certain time in the order of a few seconds, below the gate electrodes under which potential wells are present.

By applying the appropriate gate voltages $\Phi_1$ to $\Phi_8$ to the gate electrodes 7 to 26 of the charge-coupled devices 51 to 54, oblong charge packets move in the direction x along the outer surface of the semiconductor material 1. In each FIG. 1-2, 4-9 and 13, the direction in which the charge packets are conveyed is indicated by an arrow. In this manner, oblong charge packets are generated and transported through the active zone of the charge-coupled devices by the gate voltages $\Phi_1$ to $\Phi_8$. In this process, the transfer of charge carriers is not based on the usual charge carrier drift or diffusion.

The average speed of the charge carriers, e.g., electrons, which move forward on electrical voltage waves (in a manner similar to water-skiers on water waves) is equal to the group speed of the electrical voltage waves. If the thermal movement of the charge carriers is neglected in a first approximation, the speed of the charge carriers is equal to the speed of the charge packets, which depends exclusively on the geometry of the component. In particular, the charge carrier speed depends on the distance $\delta x$ between the center lines of two adjoining gate electrodes and on the pulse frequency f of the gate voltages $\Phi_1$ to $\Phi_8$ (since $v=\delta x/\delta t=\delta x.f$). To ensure that the charge packets move as "smoothly" as possible along the outer surface of the semiconductor material 1, the charge-coupled device should have as many phases as possible. In any case, the charge coupled device should have more than three phases. By increasing the number of phases, the forward stepsize of each charge packet is decreased for a given period of the sinusoid or saw-tooth shaped signal from which the discrete values of the gate voltages are produced.

The above-described operation of the charge-coupled device is the normal and known manner of its operation. The operation as described above, without further modification to the charge-coupled device, cannot be used to measure magnetic fields. Conventional charge-coupled devices are optimized with respect to "timing" and charge quantity in the conveyed charge packet. In the charge-coupled device used in the magnetic field sensor according to the present invention, "timing" is still important, but the charge quantity in the charge packet is of secondary importance.

A charge-coupled device may be modified to measure magnetic fields in accordance with these criteria. The operation of the magnetic field sensor, according to the present invention, is described below.

Referring now to FIG. 1, when the charge-coupled device is exposed to a magnetic field, or to an associated magnetic field induction B directed at a right angle to the outer surface of the semiconductor region 1, each moving charge packet exposed to the magnetic field induction B is subjected to a Lorentz force F directed along the longitudinal sense of the charge packets. As depicted in FIG. 1, this Lorenzt Force is also parallel to the longitudinal direction of the gate electrodes 7 to 26. In this case, the equation $F=q.(v.B)$ applies, where q is the charge of the charge carriers of the charge packet, e.g., of the electrons.

The Lorentz force F produces an increase in charge carriers on one side of the charge packets and a depletion of charge carriers on the other side of the charge packets. This uneven distribution of charge carriers along the oblong charge packets induces an electrical field directed in parallel with the longitudinal sense of the charge packets. The induced electric field, in turn, induces a voltage difference between the two ends of the charge packets which increases as the length of the charge packets and the effective lengths L of the central gate electrodes 15 to 18 increase. Since the two ends of the charge packets under the central gate electrodes 15 to 18 are at least intermittently in electrical contact with the contact surfaces 4 and 5 (and thereby also with the sensor connections S1 and S2), the aforementioned voltage difference is equal to the output voltage $V_{s1,s2}$ of the magnetic field sensor. In this case, the equation: $V_{s1,s2} = v.B.L = \delta x.f.B.L$ applies. For $\delta x = 10$ μm, L = 1 mm, B = 1 Tesla and f = 10 MHz, $V_{s1,s2}$ can be equal to 100 mV, for instance.

The output voltage appearing at the sensor connections S1 and S2 of the magnetic field sensor thus calculated is proportional to the magnetic field induction B, the effective length L of the central gate electrodes 15 to 18 and the velocity of the charge packets. As mentioned earlier, the velocity depends only on δx and on the pulse frequency f of the gate voltages $\Phi_1$ to $\Phi_8$. Further, L and δx are exclusively geometrical parameters of the magnetic field sensor. As a result, the output voltage $V_{s1,s2}$ of the magnetic field sensor according to the present invention, in contrast to that of a Hall-effect component, is independent of the supply voltage conditions, the mobility of the charge carriers, the carrier concentration and/or environmental conditions.

Figure 12:
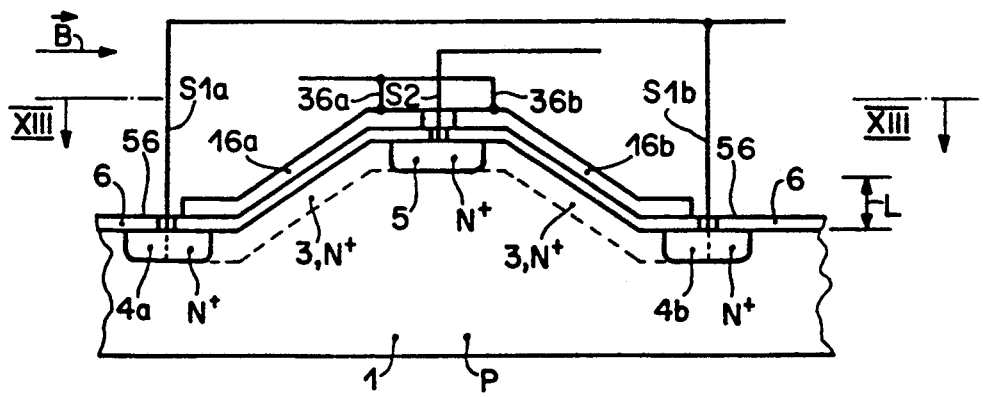
FIG. 12 shows a cross-section through a seventh embodiment of the magnetic field sensor according to the invention.
Figure 13:
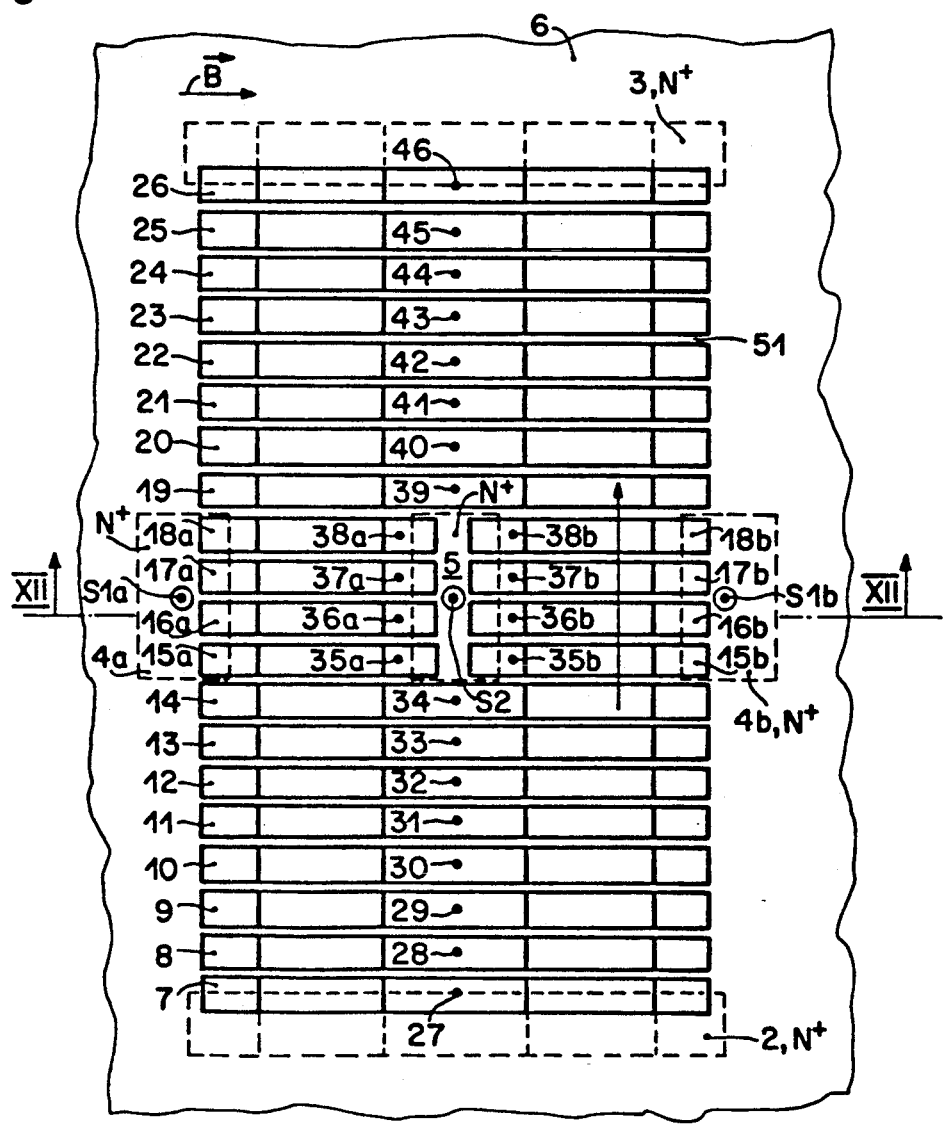
FIG. 13 shows a top view of the seventh embodiment of the magnetic field sensor depicted in FIG. 12.

Referring now to FIGS. 12–13, the seventh embodiment of the magnetic field sensor according to the invention is described. The seventh embodiment is capable of measuring magnetic fields or magnetic field inductions B which impinge at a parallel to the outer surface of the semiconductor material 1.

The seventh embodiment shown is similar in construction to the first embodiment, with several differences. In the seventh embodiment, the outer surface of the semiconductor material 1 of the second conductivity type P, which is covered with the insulating layer 6, is shaped like an oblong mound, at least at the location of each charge-coupled device. This mound has a nearly trapezoidal cross-section at a right angle to its longitudinal axis and is surrounded at its foot, by a bottom surface 56. Such a mound is provided for each charge-coupled device. In FIG. 13 only a single charge-coupled device 51 is shown. The mounds may illustratively be produced by means of a conventional V-groove etching method.

The second contact zone 5 is located near the center of the top of each mound. The two halves 4a and 4b of the first contact zone 4 are formed in the bottom surface 56, on both sides and at the same height. The two halves 4a and 4b are electrically connected to each other externally and together comprise the first contact zone 4. The gate electrodes 7 to 26, the input zone 2 and the output zone 3 of each charge-coupled device are in the form of strips. They are arranged in parallel along the outer circumference of trapezoid cross-sections of the associated mound. Each additionally covers a respective portion of the bottom surface 56 on both sides of the respective portion of the mound. Each strip overlaps the entire rise of the mound except for at least one center gate electrode 15, 16, 17 or 18 of each charge-coupled device which has a gap in its center at the top of the mound. As depicted in FIG. 13, each gate electrode 15–18 so formed consists of two z-shaped gate electrode elements 15a, 15b or 16a, 16b or 17a, 17b or 18a, 18b. The two ends of each gate electrode 15–18 partly overlap the second contact zone 5 and a corresponding half 4a or 4b of the first contact zone 4. The two halves 4a and 4b comprise a semiconductor material of the first conductivity type N+ which is heavily doped with impurity atoms. Each half 4a and 4b is provided with a sensor connection S1a or S1b going through two passages of the insulating layer 6. Thus, zones 4a and 4b may be electrically connected to each other externally. Each gate electrode element 15a to 18a and 15b to 18b has a gate connection 35a, 36a, 37a, 38a, 35b, 36b, 37b or 38b. Each pair of gate connections 35a and 35b, 36a and 36b, 37a and 37b as well as 38a and 38b are externally electrically connected to each other.

The lengths of the gate electrodes can be broken down vectorially into an effective length L, directed perpendicularly to the bottom surface 56, and into a non-effective length, directed in parallel with the bottom surface 56. The direction of the magnetic field or of the corresponding magnetic induction B to be measured and the orientation of the charge-coupled devices are, again, at right angles to each other and at a right angle to the effective length L of the gate electrodes 7 to 26. Thus, the seventh embodiment works in a manner similar to the first six embodiments.

Finally, the above-mentioned embodiments are intended to be illustrative of the invention. Numerous other embodiments may be devised by those ordinarily skilled in the art without departing from the scope of the following claims.

I claim:

1. A magnetic field sensor, having a charge-coupled device formed in a semiconductor region, comprising:
    first and second contact zones, comprising a semiconductor material of a first conductivity type, heavily doped with impurity atoms, located on an outer surface of said semiconductor region which has a second conductivity type, each contact zone having a respective sensor connection; and
    an insulating layer, located on said outer surface of said semiconductor region, having passages for said sensor connections associated with said first and second contact zones;
    wherein said charge-coupled device comprises a plurality of oblong gate electrodes located on said insulation layer, said gate electrodes being arranged perpendicularly to a direction of charge propagation through said charge-coupled device,
    wherein one end of at least one centrally located gate electrode of said charge-coupled device at least partially overlaps said first contact zone and another end at least partially overlaps said second contact zone,
    wherein one of said contact zones is centrally located,
    wherein the other contact zone surrounds said centrally located contact zone,
    wherein said gate electrodes are arranged between said contact zones perpendicularly to the boundary of said contact zone which surrounds said centrally located contact zone, and
    wherein one end of each of said gate electrodes at least partially overlaps said first contact zone and another end at least partially overlaps said second contact zone.

2. The magnetic field sensor of claim 1 wherein said centrally located contact zone is circular and wherein said contact zone which surrounds said centrally located contact zone is annular.

3. The device of claim 1 wherein said first conductivity type is N-type and said second conductivity type is P-type.

4. A magnetic field sensor, having a charge-coupled device formed in a semiconductor region, comprising:
    first and second contact zones, comprising a semiconductor material of a first conductivity type, heavily doped with impurity atoms, located on an outer surface of said semiconductor region which has a second conductivity type, each contact zone having a respective sensor connection; and
    an insulating layer, located on said outer surface of said semiconductor region, having passages for said sensor connections associated with said first and second contact zones;

wherein said charge-coupled device comprises a plurality of oblong gate electrodes located on said insulating layer, said gate electrodes being arranged perpendicularly to a direction of charge propagation through said charge-coupled device, wherein one end of at least one centrally located gate electrode of said charge-coupled device at least partially overlaps said first contact zone and another end at least partially overlaps said second contact zone, wherein said charge-coupled device further comprises input and output zones, comprising a semiconductor material of said first conductivity type, heavily doped with impurity atoms, located in said semiconductor region, and wherein said gate electrodes are arranged in a straight row extending at a right angle to a longitudinal axis of each gate electrode, and wherein the dimensions, perpendicular to said extension of said row, of the gate electrodes and said input and output zones are nearly equal.

5. The magnetic field sensor of claim 4 wherein said input and output zones and one of said contact zones are both connected via an electrical connection.

6. The magnetic field sensor of claim 5 wherein said electrical connection comprises a semiconductor material of said first conductivity type, which is heavily doped with impurity atoms.

7. The magnetic field sensor of claim 4 wherein a plurality of charge-coupled devices formed in said semiconductor region are electrically connected in series, wherein each input and output zone of each charge-coupled device and one of said contact zones are connected via said electrical connection, wherein said other contact zone is centrally located with respect to said charge-coupled devices, and wherein one end of at least one centrally located gate electrode of each charge coupled device at least partially overlaps said first contact zone and another end at least partially overlaps said second contact zone.

8. The magnetic field sensor of claim 7 wherein two charge-coupled devices are formed in said semiconductor region and are spatially arranged in parallel to one another.

9. The magnetic field sensor of claim 7 wherein four charge-coupled devices are formed in said semiconductor region, said centrally located contact zone being cross-shaped, and wherein said charge coupled devices are arranged along the sides of a square, each side being parallel to a beam axis of said cross-shaped contact zone.

10. A magnetic field sensor, having a charge-coupled device formed in a semiconductor region, comprising:

first and second contact zones, comprising a semiconductor material of a first conductivity type, heavily doped with impurity atoms, located on an outer surface of said semiconductor region which has a second conductivity type, each contact zone having a respective sensor connection; and an insulating layer, located on said outer surface of said semiconductor region, having passages for said sensor connections associated with said first and second contact zones;

wherein said charge-coupled device comprises a plurality of oblong gate electrodes located on said insulating layer, said gate electrodes being arranged perpendicularly to a direction of charge propagation through said charge-coupled device, wherein one end of at least one centrally located gate electrode of said charge-coupled device at least partially overlaps said first contact zone and another end at least partially overlaps said second contact zone, wherein said outer surface of said semiconductor region has, at least at the location of each charge-coupled device, an oblong mound shape with a nearly trapezoidal cross-section in a direction perpendicular to the longitudinal axis of each charge-coupled device, said oblong-shaped mound being surrounded at its foot by a bottom surface, said second contact zone being located nearly in the middle of the top of a respective mound-shaped charge-coupled device;

wherein said first contact zone comprises two half zones located at the same height at the bottom of said mound at said foot, said two half zones being electrically connected to one another;

wherein said gate electrodes, said input zone and said output zone of each charge-coupled device are strip-shaped, each being arranged in parallel along the outer circumference of said trapezoidal cross-sections of said respective mound-shaped charge-coupled device, each covering a portion of said bottom surface at the bottom of both sides of said respectively mound-shaped charge-coupled device, and wherein at least one centrally located gate electrode of each charge-coupled device has a gap at its center on top of its respective mound-shaped charge-coupled device, said at least one centrally located electrode comprising two Z-shaped gate electrode elements, one end of each gate electrode element at least partially overlapping said second contact zone, and another end at least partially overlapping a respective half zone.

11. A magnetic field sensor, having a charge-coupled device formed in a semiconductor region, comprising:

first and second contact zones, comprising a semiconductor material of a first conductivity type, heavily doped with impurity atoms, located on an outer surface of said semiconductor region which has a second conductivity type, each contact zone having a respective sensor connection; and an insulating layer, located on said outer surface of said semiconductor region, having passages for said sensor connections associated with said first and second contact zones;

wherein said charge-coupled device comprises a plurality of oblong gate electrodes located on said insulating layer, said gate electrodes being arranged perpendicularly to a direction of charge propagation through said charge-coupled device, wherein one end of at least one centrally located gate electrode of said charge-coupled device at least partially overlaps said first contact zone and another end at least partially overlaps said second contact zone, wherein at least one of said contact zones comprises:

a plurality of contact zone sub-elements having nearly the same width of a gate electrode, each of which being at most a few micrometers from an edge of a respective, consecutive, centrally located gate electrode;

an additional contact zone element, comprising a semiconductor material of said first conductivity type, heavily doped with impurity atoms, located on an outer surface of said semiconductor region, said additional contact zone element being connected to said respective sensor connection of said at least one of said contact zones; and a read-out gate electrode located on said insulating layer, said read-out gate electrode at least partially overlapping said additional contact zone element and each of said contact zone sub-elements.

12. The device of claim 4 wherein said first conductivity type is N-type and wherein said second conductivity type is P-type.

13. The device of claim 10 wherein said first conductivity type is N-type and wherein said second conductivity type is P-type.

14. The device of claim 11 wherein said first conductivity type is N-type and wherein said second conductivity type is P-type.

* * * * *